United States Patent [19]

Geen et al.

[11] Patent Number: 4,649,992

[45] Date of Patent: Mar. 17, 1987

[54] DIAMOND HEATSINK ASSEMBLIES

[75] Inventors: Michael W. Geen; Ralph M. Eaton, both of Northampton, England

[73] Assignee: Plessey Overseas Limited, Ilford, England

[21] Appl. No.: 831,491

[22] Filed: Feb. 21, 1986

Related U.S. Application Data

[63] Continuation-in-part of Ser. No. 657,504, Oct. 4, 1984, abandoned.

[30] Foreign Application Priority Data

Oct. 5, 1984 [GB] United Kingdom ............... 8425279

[51] Int. Cl.⁴ .............................................. F28F 7/00
[52] U.S. Cl. .................................. 165/185; 165/80.1; 357/81
[58] Field of Search ................. 165/185, 80.1; 357/81

[56] References Cited

U.S. PATENT DOCUMENTS

| | | | |
|---|---|---|---|
| 3,678,995 | 7/1972 | Collard | 165/185 |
| 3,828,848 | 8/1974 | Custer et al. | 165/185 |
| 3,872,496 | 3/1975 | Potter | 165/185 |
| 3,949,263 | 4/1976 | Harper | 165/185 X |
| 4,576,224 | 3/1986 | Eaton et al. | 165/185 X |

FOREIGN PATENT DOCUMENTS 1216593 12/1970 United Kingdom ............... 165/185

Primary Examiner—Albert W. Davis, Jr.
Assistant Examiner—Peggy Neils
Attorney, Agent, or Firm—Fleit, Jacobson, Cohn & Price

[57] ABSTRACT

A diamond heatsink assembly for small electronic components such as microwave or millimetric wave devices comprises a frusto-conical shaped diamond held on a support by a clamping member with a part-conical hole through it. One or both of the support and the clamping member are made of a high thermal conductivity metal such as gold, silver, copper or aluminum. The clamping member may be secured to the support by soldering, friction welding, a screw thread or any other suitably tight clamping method. The diamond, the support and the clamping member may be metallized to reduce electrical skin resistance. The arrangement is an improvement on diamond heatsinks in which a diamond is simply bonded to the support by soldering or brazing and heatsinks in which the diamond is pressed into the surface of the support.

15 Claims, 3 Drawing Figures

DIAMOND HEATSINK ASSEMBLIES

RELATED APPLICATION

This is a continuation in part of application Ser. No. 6/657,504, filed Oct. 4, 1984 (now abandoned).

BACKGROUND OF THE INVENTION

This invention relates to diamond heatsink assemblies which are particularly suitable for mounting small electronic devices thereon which emit a fair degree of heat.

It is known to provide a diamond as a heatsink for such devices since the thermal conductivity of a diamond mounted on a suitable metal member of high thermal conductivity is at least twice that of a metal member without the diamond. The metal member usually comprises a threaded stud of gold, silver or copper with the diamond pressed into the end, or the diamond may be mounted on top of the stud by soldering, brazing or welding. The stud is adapted to be screwed into a base or wall member until the end of the stud is substantially aligned with the surface of the base or wall member with the electronic device mounted centrally on the diamond. The electronic device may, for example project into a waveguide.

Problems with these arrangements are that the electronic device cannot be independently rotated on the stud to align the electronic device at a particular angle and that an all threaded stud has poor electrical and thermal contact with the base or wall member because of the small area of actual contact between the screw threads. The threaded stud must also be completely replaced if the electronic device becomes faulty.

Pressing the diamond into the heatsink has several disadvantages in that the diamond may fall out of the stud during severe environmental trials unless elaborate techniques such as high temperature brazing or the use of solder preforms are employed. The diamond-metal surface after pressing may not be very flat leading to problems with electrical continuity and the ability to mount other components, such as insulating stand-offs and the electronic device itself. There is also a possibility that the diamond may fracture when it is pressed into the stud.

When the diamond is mounted on top of the stud the electronic device is no longer in a mechanically equivalent position to that of the metal heatsink. This can lead to undesirable parasitic impedances in microwave and millimetric wave devices. Although the effect can sometimes be used to advantage, it is common practice that a diamond heatsink device is developed from a lower cost metal heatsink technology device and electrical equivalence may be important.

The diamond-to-metal bond relies on the contact at one surface, and since the electronic device is likely to be temperature cycled or undergo extreme temperature changes, this bond may be overstressed by differential thermal expansion effects, made more severe by the large (0.5-1mm diameter) diamond.

It is an object of the present invention to provide a diamond heatsink assembly which will eliminate or reduce at least some of these problems.

SUMMARY OF THE INVENTION

According to an aspect of the present invention a diamond heatsink assembly comprises a diamond mounted on a mounting member, the diamond having a base, a mounting surface and at least one sidewall, the at least one sidewall being inclined to the base whereby the area of the mounting surface is less than the area of the base, and a clamping member having an orifice of identical shape to the diamond for surrounding and contacting the diamond on the full area of the sidewall or sidewalls of the diamond for making thermal contact, the clamping member being adapted to be secured to the mounting member in a manner resilient under thermal treatment, at least one of the clamping member and the mounting member being formed of a high thermal conductivity metal for dissipating heat conducted from the diamond.

BRIEF DESCRIPTION OF THE DRAWINGS

Further aspects of the invention will become apparent from the following description of an embodiment of the invention with reference to the accompanying drawings in which.

DESCRIPTION OF THE PREFERRED EMBODIMENT

Figure 1:
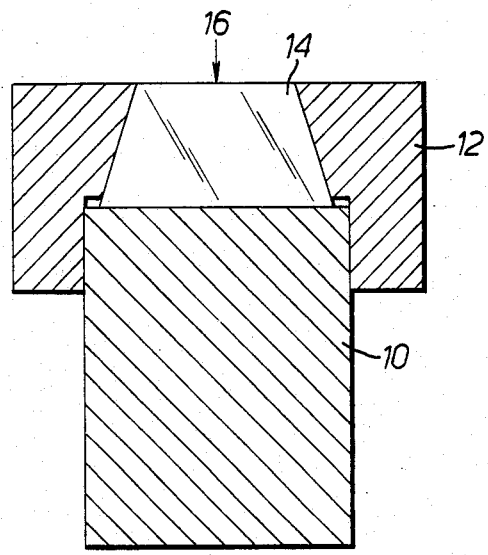
FIG. 1 is a cross-sectional view of a diamond heatsink assembly constructed in accordance with the invention.
Figure 2:
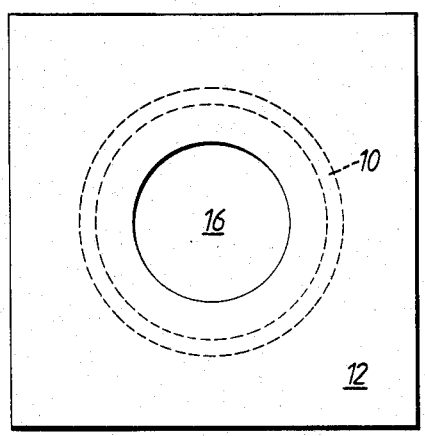
FIG. 2 shows in plan view a frusto-conical embodiment of the invention.
Figure 3:
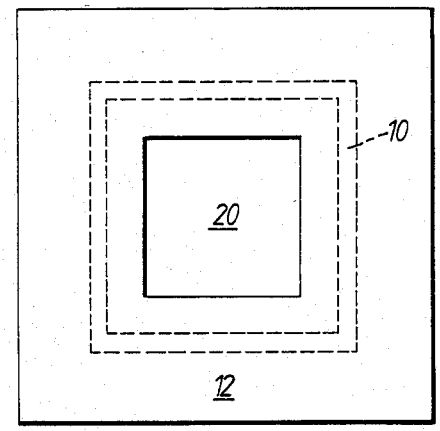
FIG. 3 shows a plan view of a truncated pyramidal shaped diamond heatsink according to the present invention.

The heatsink assembly comprises a mounting member 10 and a clamping member 12. These are made of metal, at least one of which must be a high thermal conductivity metal such as gold, silver, copper or aluminium. The parts 10 and 12 may be plated with another metal to reduce electrical skin resistance, offer environmental protection or for good soldering. The clamping member 12 may be made by turning on a lathe or parting from rod and then a conical hole is produced by machining or spark erosion. The mounting member may be turned or parted from rod and extends into the clamping member. The diamond 14 is a frusto-conical shape and may be produced by conventional techniques, with the conical edge provided by a laser. The top face 16, must be lapped and polished. The diamond may have a thin layer of metal such as gold, silver, copper or aluminium (typically 1 micron) on the top face only or on all faces, or the metallisation for electrical continuity may be applied by evaporation or sputtering to the complete construction after assembly. The diamond is held in place on the mounting member 10 by the clamping member 12 giving good thermal contact between the diamond and both metal parts. The assembly of the mounting member 10 to the clamping member 12 may be by one of several methods:

(i) If the diamond has been metallised on the lower face, the mounting member 10 may be soldered to the clamping member and to the diamond, (ii) The clamping member and the mounting member may be threaded and the two screwed together, (iii) The mounting member 10 may be press fitted to the clamping member 12, (iv) The mounting member 10 may be friction welded or soldered to the clamping member 12, (v) The mounting member may be fitted to the clamping member utilising differential thermal expansion, e.g. by freezing the mounting member in liquid nitrogen for an easy fit to the clamping member.

The heatsink assembly may allow the top of the diamond to stand proud of the package surface.

The mounting member 10 may extend beyond the base of the clamping member 12 as shown in the drawing to provide convenient mounting to a collet, or it may remain flush with the base of the clamping member 12.

The semiconductor device is mounted on the top face 16 of the diamond, and insulating rings or stand-offs may be mounted on the clamping member 12 or the diamond 14 or partly on the clamping member and the diamond.

Instead of having a frusto-conical shape the diamond could be formed with a truncated pyramid 20 with a three or more sided base.

We claim:

1. A diamond heatsink assembly comprising a diamond mounted on a mounting member, the diamond having a base, a top face for receiving a heat emitting device and at least one sidewall, the at least one sidewall being inclined to the base and to the top face whereby the area of the top face is less than the area of the base, and a clamping member having a first opening of identical cross-sectional shape to that of the top face of the diamond, said first opening having an inwardly extending sidewall for surrounding and contacting the diamond on the full area of the at least one sidewall of the diamond for making thermal contact therewith, said inwardly extending sidewall terminating in a second opening spaced from said first opening, a mounting member adapted to cooperatively engage with the clamping member and in surface contact with the base of the diamond, the second opening of the clamping member being of identical cross-sectional shape to that of the mounting member, the mounting member extending into the second opening of the clamping member and adapted to be secured thereto in good surface contact therewith for good thermal conductivity, at least one of the clamping member and the mounting member being formed of a high thermal conductivity metal for dissipating heat conducted from the diamond.

2. A diamond heatsink assembly as claimed in claim 1 in which the diamond has a plurality of sidewalls inclined to the base.

3. A diamond heatsink assembly as claimed in claim 1 in which the diamond has a truncated pyramid shape.

4. A diamond heatsink assembly as claimed in claim 1 in which the diamond has a frusto-conical shape.

5. A diamond heatsink assembly as claimed in claim 1 in which the diamond is coated on at least its mounting surface with a layer of metal.

6. A diamond heatsink assembly as claimed in claim 1 in which the contacting surfaces of the clamping and mounting members are plated with a layer of metal to reduce electrical skin resistance.

7. A diamond heatsink assembly as claimed in claim 5, in which the layer of metal is gold.

8. A diamond heatsink assembly as claimed in claim 5, in which the layer of metal is silver.

9. A diamond heatsink assembly as claimed in claim 5, in which the layer of metal is copper.

10. A diamond heatsink assembly as claimed in claim 5, in which the layer of metal is aluminium.

11. A diamond heatsink assembly as claimed in claim 1, in which at least one of the clamping member and the mounting member are formed from gold.

12. A diamond heatsink assembly as claimed in claim 1, in which at least one of the clamping member and the mounting member are formed from silver.

13. A diamond heatsink assembly as claimed in claim 1, in which at least one of the clamping member and the mounting member are formed from copper.

14. A diamond heatsink assembly as claimed in claim 1, in which at least one of the clamping member and the mounting member are formed from aluminium.

15. A diamond heatsink assembly as claimed in claim 1, in which the clamping member includes an outer face and the top face of the diamond is continuous with the outer face of the clamping member.

* * * * *